United States Patent
Fuchs et al.

(10) Patent No.: US 7,745,908 B2
(45) Date of Patent: Jun. 29, 2010

(54) SEMICONDUCTOR COMPONENT CONTAINING COMPOUND OF ALUMINUM, GALLIUM, INDIUM, ARSENIC, AND ANTIMONY HAS MESA STRUCTURE WHOSE SIDES HAVE PASSIVATION LAYER OF COMPOUND OF ALUMINUM, GALLIUM, ARSENIC, AND ANTIMONY

(75) Inventors: Frank Fuchs, Denzlingen (DE); Robert Rehm, Denzlingen (DE); Martin Walther, March (DE)

(73) Assignee: Fraunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 297 days.

(21) Appl. No.: 11/572,888

(22) PCT Filed: Jul. 25, 2005

(86) PCT No.: PCT/EP2005/008075

§ 371 (c)(1),
(2), (4) Date: Jan. 29, 2007

(87) PCT Pub. No.: WO2006/013034

PCT Pub. Date: Feb. 9, 2006

(65) Prior Publication Data

US 2007/0278626 A1 Dec. 6, 2007

(30) Foreign Application Priority Data

Jul. 30, 2004 (DE) .................... 10 2004 037 191

(51) Int. Cl.
*H01L 29/06* (2006.01)

(52) U.S. Cl. ............... 257/626; 257/586; 257/E23.032; 257/E29.006; 257/E29.007; 257/E29.012; 257/E29.013; 257/E29.016; 257/E29.024

(58) Field of Classification Search ............... 257/626, 257/E23.032, 586, E29.006, E29.007, E29.012, 257/E29.013, E29.016, E29.024
See application file for complete search history.

(56) References Cited

U.S. PATENT DOCUMENTS

| | | | | |
|---|---|---|---|---|
| 5,665,612 A | * | 9/1997 | Lee et al. | 438/40 |
| 5,712,504 A | * | 1/1998 | Yano et al. | 257/452 |
| 6,407,439 B1 | | 6/2002 | Hier et al. | |
| 6,674,777 B1 | | 1/2004 | Nohava et al. | |

(Continued)

FOREIGN PATENT DOCUMENTS

GB 2133928 8/1984

(Continued)

OTHER PUBLICATIONS

English Language Abstract of JP 11-274167.

*Primary Examiner*—Phat X Cao
*Assistant Examiner*—Diana C Garrity
(74) *Attorney, Agent, or Firm*—Greenblum & Bernstein, P.L.C.

(57) ABSTRACT

A Semiconductor component that contains $Al_xGa_yIn_{1-x-y}As_zSb_{1-z}$, whereby the parameters x, y, and z are selected such that a bandgap of less than 350 meV is achieved, whereby it features a mesa-structuring and a passivation layer containing $Al_nGa_{1-n}As_mSb_{1-m}$ is applied at least partially on at least one lateral surface of the structuring, and the parameter n is selected in the range of 0.4 to 1 and the parameter m in the range of 0 to 1.

32 Claims, 4 Drawing Sheets

U.S. PATENT DOCUMENTS

| | | |
|---|---|---|
| 7,095,050 B2 | 8/2006 | Wanlass et al. |
| 2002/0084468 A1 | 7/2002 | Yuan |
| 2002/0185655 A1 | 12/2002 | Fahimulla et al. |
| 2003/0211642 A1 | 11/2003 | Nohava et al. |
| 2004/0217374 A1 | 11/2004 | Yuan |
| 2006/0144435 A1 | 7/2006 | Wanlass |
| 2006/0162768 A1 | 7/2006 | Wanlass et al. |
| 2006/0240670 A1 | 10/2006 | Bugge et al. |
| 2007/0137698 A1 | 6/2007 | Wanlass et al. |

FOREIGN PATENT DOCUMENTS

| | | |
|---|---|---|
| JP | 11-274167 | 10/1999 |
| WO | 03/073517 | 9/2003 |
| WO | 03/100868 | 12/2003 |
| WO | 2004/059038 | 7/2004 |

\* cited by examiner

SEMICONDUCTOR COMPONENT CONTAINING COMPOUND OF ALUMINUM, GALLIUM, INDIUM, ARSENIC, AND ANTIMONY HAS MESA STRUCTURE WHOSE SIDES HAVE PASSIVATION LAYER OF COMPOUND OF ALUMINUM, GALLIUM, ARSENIC, AND ANTIMONY

CROSS REFERENCE TO RELATED APPLICATIONS

This application is a National Stage entry under 35 U.S.C. §371 of International Application PCT/EP2005/08075, which was filed Jul. 25, 2005, the disclosure of which is expressly incorporated by reference herein in its entirety. Moreover, this application claims priority under 35 U.S.C. §119 to German Paten Application No. DE 10 2004 037 191.1, filed Jul. 30, 2004, the disclosure of which is expressly incorporated by reference herein in its entirety.

BACKGROUND OF THE INVENTION

1. Field of the Invention

The invention relates to a semiconductor component with a passivation layer and a method for its production. Passivation is understood to mean the coating of flat or structured components such that the electrical properties of the component are not a function of the ambient atmosphere.

2. Discussion of Background Information

The surface of a semiconductor represents a disturbance of the periodic lattice that changes the electrical properties of the semiconductor considerably. This causes the formation of surface states that can be modified by the chemisorption or physisorption of adsorbates. The result is a space-charge zone, the expansion and character of which largely determine the properties of the surface. This exerts an impact onto the position of the Fermi level in the active region of the component and consequently to a dependence of the electrical properties on the ambient atmosphere, e.g., air humidity and/or process chemistry. The consequence of the changing surface states are surface leakage currents that raise the noise level of a semiconductor component. The performance of active components, in particular those made of materials with a small bandgap (e.g., infrared photodiodes), is essentially dependent on the noise contributions. Therefore, an effective passivation is essential in particular for the permanent suppression of surface leakage currents and for the stabilization of the electrical properties of the surface of the component.

Generally, components based on elemental semiconductors such as silicon or germanium and the III-V-semiconductors are passivated by applying a layer of insulator material. Customary materials for this are $SiO_2$, $Si_xN_y$, or $SiO_xN_y$. These are applied by various deposition methods, e.g., low pressure chemical vapor deposition (LPCVD), plasma enhanced chemical vapor deposition (PECVD), or sputtering.

Semiconductor components with a small bandgap, e.g., mercury-cadmium-telluride (MCT) can be conventionally passivated by a material with a larger bandgap, e.g., CdTe. The effect of the passivation rests hereby on the combination of the semiconductor CdTe having a large bandgap ($E_g$=1.6 eV) with the diode material of the component having a smaller bandgap ($E_g$<350 meV). As a result, an expansion of the effective bandgap occurs in the region of the diode. This leads to a depletion of the respective minority charge carrier in the border area of the diode and thus to a reduction in the surface leakage currents. The methods and processes for the production as well as the processing of MCT are elaborate, error-prone, and cost-intensive.

Furthermore, semiconductor components with a small bandgap can also be produced on the basis of the alloy $Al_xGa_yIn_{1-x-y}As_zSb_{1-z}$. Depending on the parameters x, y, and z, a bandgap of less than 350 meV can be achieved.

Components with small bandgaps can be produced in particular by application of heterostructures and superlattices of two different alloys, such as, e.g., InAs and $Ga_{1-x}In_xSb$ single layers with thicknesses of between 2 nm and 10 nm. However, the passivation of such components has not hitherto been possible in a simple manner.

SUMMARY OF THE INVENTION

Accordingly, the invention is directed to a method for the passivation of $Al_xGa_yIn_{1-x-y}As_zSb_{1-z}$-containing semiconductor components having a small bandgap.

According to the invention, a semiconductor component that contains $Al_xGa_yIn_{1-x-y}As_zSb_{1-z}$, whereby the parameters x, y, and z are selected such that a bandgap of less than 350 meV is achieved, it features a mesa-structuring, and a passivation layer containing $Al_nGa_{1-n}As_mSb_{1-m}$ is applied at least partially on at least one lateral surface of the structuring, whereby the parameter n is selected in the range of 0.4 to 1 and the parameter m in the range of 0 to 1.

The invention is directed to a method for the production of a semiconductor component that comprises the following steps:

production of at least one active semiconductor region from a material containing $Al_xGa_yIn_{1-x-y}As_zSb_{1-z}$ with a bandgap of less than 350 meV, formation of mesa structures in the active semiconductor region, and application of a passivation layer containing $Al_nGa_{1-n}As_mSb_{1-m}$ on the surface of the active semiconductor region, whereby the parameter n is selected in the range of 0.4 to 1 and the parameter m in the range of 0 to 1.

Between the highest still fully populated band (valence band) and the conduction band located above it, lies an energy region in which according to quantum mechanics, electron states are forbidden. This region is called the bandgap. Semiconductor components with different fields of application require different bandgaps.

The active semiconductor region can be produced, for example, by epitaxial deposition on GaSb substrates or GaSb buffer layers with 001 orientation. It is thereby familiar to one skilled in the art to adjust the lattice constant and the bandgap according to the desired application by varying the parameters x, y, and z in the production of the active semiconductor region. In order to achieve small and extremely small bandgaps down to 60 meV, one of ordinary skill in the art will also consider in particular superlattices composed, for example, of InAs, GaSb, InSb, AlSb, and their mixed sequences. One of ordinary skill in the art will consider in particular superlattices comprising InAs and $Ga_{1-x}In_xSb$ individual layers with thicknesses between 2 nm and 10 nm.

In order to be able to grow a passivation layer with the fewest possible defects, a high adhesion, and low mechanical stresses, it is advantageous if the material of the passivation layer has approximately the same lattice constant as the material of the semiconductor component. By varying the parameter m, the As content in the $Al_nGa_{1-n}As_mSb_{1-m}$ alloy can be adjusted and matched to its lattice constant. One of ordinary skill in the art will of course select an As content having an optimum matching to the base material. In particular, one of ordinary skill in the art will consider thereby the range of about 0 to about 0.15.

The parameter n denotes the Al content in the compound. In embodiments, the passivating effect of the layer according to the invention is set when the parameter n is selected in the range of about 0.4 to 1. A range of about 0.5 to about 0.85 is particularly preferred. With too low a content of Al, the effect of the passivation layer is insufficient. Raising the Al content increases the bandgap of the $Al_nGa_{1-n}As_mSb_{1-m}$ alloy and thus the passivating effect. However, too high a percentage of Al leads to an accelerated oxidation-caused degeneration of the passivation layer.

A further optimization of the passivation layer is possible by targeted p-doping or n-doping of the layer material. Through this measure, the Fermi level at the interface of the active region/passivation layer of the component can be influenced. For example, the surface leakage currents can be influenced in a targeted manner by doping with beryllium or tellurium. Of course, one skilled in the art will select the type and amount of the dopant depending on the field of application, the semiconductor material, and the composition of the passivation layer.

The use of the passivation layer according to the invention is particularly preferred especially with bipolar photodiodes with a bandgap between about 60 meV and about 300 meV. The performance of these components is determined quite considerably by surface leakage currents. These surface leakage currents can be controlled or minimized by the passivation layer.

Although the passivation layer according to the invention is equally suited for flat and structured components, it is suitable in particular for mesa-structured components. Mesa structures are structures projecting above the wafer surface, in approximately the shape of a mesa, with a plateau-shaped flattening on the upper side and bordering lateral surfaces.

The mesa structures can thereby be round or angular. In particular the mesa structures can also have a square base surface. It is particularly preferred for the bordering lateral surfaces to feature an orientation of about 45 degrees to the natural cleavage planes of the crystal. Thus, the two flanks of a mesa structure are largely equivalent crystallographically, they are etched in the same manner during the etching process and are overgrown epitaxially in the same manner.

Since the ratio of volume to surface is worse with mesa structures than with flat components, the surface leakage currents in this case have a particularly great effect and the passivation of the surfaces is particularly important in this case.

In embodiments, an antioxidant layer is applied on the passivation layer, at least partially in order to protect the passivation layer from oxidation. In principle, all materials are suitable for this protective layer that are impermeable to oxidizing compounds and can be deposited as a thin layer with a thickness of about 10 nm to about 2 μm. The influence on the passivation layer of, for example, atmospheric oxygen or oxidizing compounds used for the processing of the component, is prevented by the antioxidant layer. Thus the long-term stability of the component is increased as desired.

Preferably, such an antioxidant layer contains $Si_pN_q$ and/or $SiO_2$ and/or $SiO_pN_q$, so that a high-impedance layer forms that itself is largely chemically inert.

One of ordinary skill in the art would understand that, for example, surface regions intended for the contacting can be provided in a simple manner with a contact of a metal or an alloy when these sites are excluded from the passivation layer and/or antioxidant layer. This can take place in predetermined surface regions by masking during the production or by subsequent removal of the passivation layer and/or antioxidant layer. An etching process is particularly suitable for the removal. The antioxidant layer can thereby also be used advantageously as an etching mask for the removal of the passivation layer.

As the method for the production of the active semiconductor region and the passivation layer, epitaxy is suitable, in particular molecular beam epitaxy. Thus, the deposition of lattice-matched, single-crystal layers is possible. The composition of the layers can be affected over wide ranges by appropriate process control.

In embodiments of the production process, the passivation layer can be applied immediately after the active semiconductor layer, without removing the wafer from the vacuum of the deposition unit.

In further embodiments, it is also possible after the deposition of the active semiconductor layer to structure it, e.g., in a conventional photolithography process. In this case, residues of the lithography process are removed by wet and/or dry chemistry.

Preferably, the surface of the active semiconductor region is cleaned after the etching, by thermal desorption under vacuum. This causes adsorbates and oxide layers situated on the surfaces to be removed and the wafer surface to be prepared for the next process step. The adhesion of the passivation layer is particularly good on a surface cleaned in this manner. Moreover, the Fermi level of the component is not affected by oxides. The oxide desorption takes place in particular at temperatures of between about 500° C. and about 620° C.

In a preferred embodiment of the method, a reduction in the Sb content of the active semiconductor layer by desorption from its surface is avoided in that the component is exposed to the molecular beam of an effusion cell during the thermal oxide desorption. Thus, the desorption of the group V atoms of the $Al_xGa_yIn_{1-x-y}As_zSb_{1-z}$ layer of the component is counteracted. If the Sb molecular beam is supplied under non-perpendicular directions of incidence, mesa-structured regions are exposed to a partial shading, according to the position of the wafer and the geometric arrangement. It is therefore advantageous to rotate the wafer. The $Al_nGa_{1-n}As_mSb_{1-m}$-containing passivation layer and optionally the antioxidant layer are applied onto the wafer that has been pretreated in this manner.

In further embodiments, the semiconductor component containing $Al_xGa_yIn_{1-x-y}As_zSb_{1-z}$ may further include layers that contain InAs and $Ga_yIn_{1-y}Sb$ having a thickness between 2 nm and 10 nm in the active region.

In preferred embodiments, the passivation layer containing $Al_nGa_{1-n}As_mSb_{1-m}$ may have the parameters m in the range of 0 to 0.15, more preferably m is 0.07, or the parameter n in the range of 0.5 to 0.85. The passivation layer may further contain a p-doping or an n-doping, wherein the doping material may comprise beryllium or tellurium.

It is also contemplated that the semiconductor component is a bipolar semiconductor component, thereby including bipolar photodiodes.

An antioxidant layer may be applied onto the semiconductor component. This antioxidant layer may also be applied onto the passivation layer, either in parts or completely covering the passivation layer. This passivation layer may be $Si_pN_q$ in combination with $SiO_2$ thereby forming layers comprising $SiO_pN_q$.

The mesa structure of the semiconductor component may have layers that have the following orientations: (010), (0-10), (100), or (-100).

The semiconductor component includes a metal contact on the surface which is not covered by the passivation layer.

The method for the production of a semiconductor component may further comprise forming an active semiconductor region from one or more layers containing InAs having a thickness between 2 and 10 nm. Furthermore, on top of the InAs layer, there may also be applied a layer containing $Ga_y In_{y-1} Sb$ having a thickness between 2 and 10 nm.

The method may further include that the parameter m of the passivation layer $Al_n Ga_{1-n} As_m Sb_{1-m}$ may range from 0 to 0.15, while the parameter n of the same layer may range between 0.5 and 0.85. Furthermore, the passivation layer may also comprise a dopant. Moreover, antioxidant layers may be applied on sides of the passivation layer that are facing away from the active semiconductor region.

The method may further include that the active semiconductor and/or the passivation layer are being produced by molecular beam epitaxy. Furthermore, the mesa structure may be formed by photolithography.

The method also includes the cleaning of the surface of the active semiconductor region by thermal desorption before the passivation layer is applied. The temperature of thermal desorption step may range between 500° C. and 620° C. Moreover, the thermal desorption may be take place with simultaneous antimony stabilization.

The semiconductor components that are produced by the method described herein also comprises infrared photodiode arrays.

In another embodiment, the present invention also includes a flat-structured semiconductor component comprising $Al_x Ga_y In_{1-x-y} As_z Sb_{1-z}$, wherein the parameters x, y, and are z are selectable to achieve a bandgap of less than 350 meV. This semiconductor component also comprises a passivation layer of $Al_n Ga_{1-n} As_m Sb_{1-m}$ that is applied on at least one lateral surface of the flat structures semiconductor component, wherein the parameter n is selectable from 0.4 to 1 and the parameter is selectable from 0 to 1.

BRIEF DESCRIPTION OF THE DRAWINGS

The invention is explained in more detail below on the basis of an exemplary embodiment and several figures, in which.

DETAILED DESCRIPTION OF THE PRESENT INVENTION

The production of an infrared photodiode is to be described by way of example.

Figure 1:
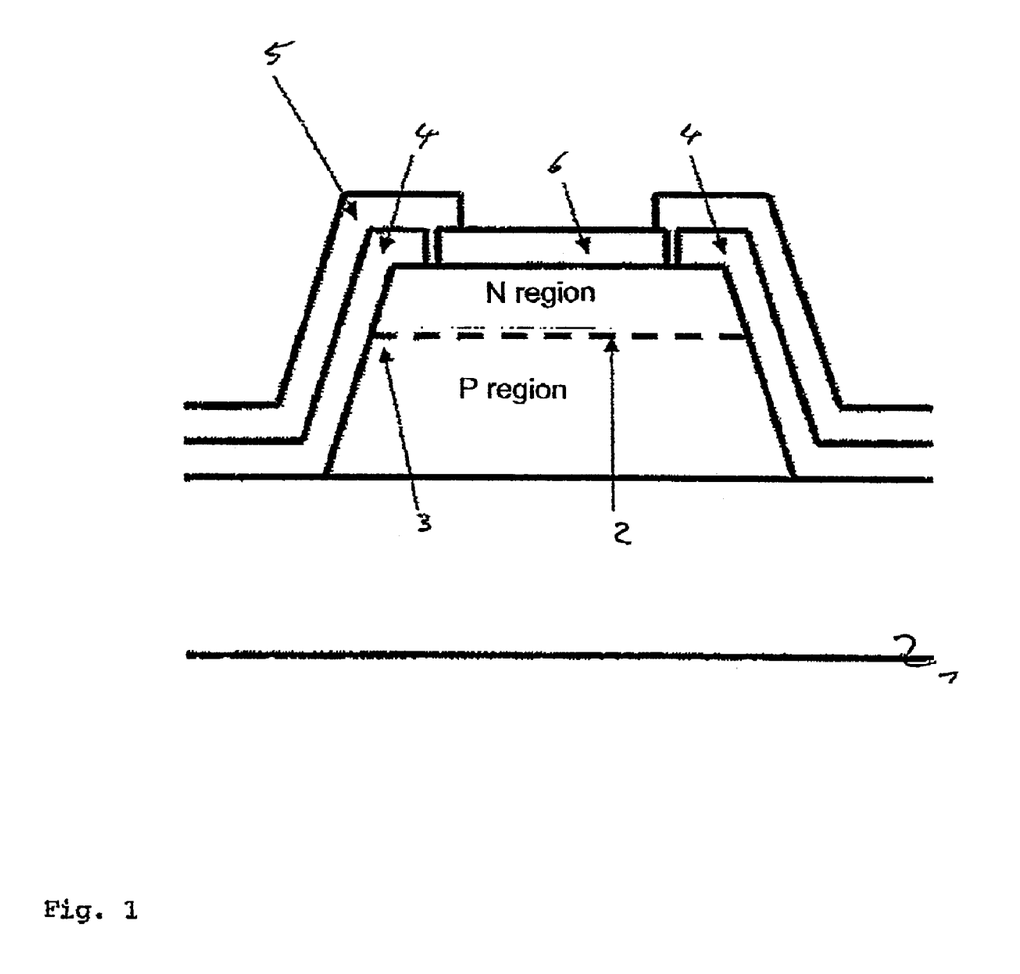
FIG. 1 shows a diagrammatic view of the layer sequence of a mesa-structured component.

In a first process step, the detector structure with a p-n junction (2) is deposited over the entire surface on a GaSb substrate (1) with (001) orientation, using molecular beam epitaxy (MBE).

Using a conventional lithography process, a structured photoresist mask is then produced on the wafer surface. The orientation of the rectangular mesa (3) takes place in the (100) or (010) direction and thus below 45 degrees to the natural cleavage planes of the crystal. The transfer of the resist structure into the semiconductor takes place by means of a wet or dry chemical etching process.

Next, the photoresist mask and any etching residues present are removed in several process steps. These include the following cleaning and etching steps:

rinsing with solvent (acetone, isopropanol)

treatment with aqueous $NH_4F$ solution and rinsing with de-ionized water (DI water)

HCl cleaning with DI water rinsing oxygen plasma treatment citric acid etching with DI water rinsing HCl cleaning with DI water rinsing.

After the complete removal of the resist mask and the etching residues, the mesa-structured wafer is again transferred into the molecular beam epitaxy unit. After the wafer has been baked to remove adsorbates, e.g. water on the surface, the oxide layers on the mesas and on the lateral flanks are desorbed thermally. This oxide desorption takes place with antimony stabilization. In order to avoid shading effects, the wafer rotates in this process step. The desorption of the oxide begins at a temperature of about 500° C. The temperature of the wafer is raised slowly to 540° C. The temperature is determined thereby with a pyrometer. The wafer remains at this temperature for 5 minutes under the above-mentioned antimony stabilization, in order to desorb the oxide layers present on the surfaces as completely as possible.

Next, an $Al_{0.5}Ga_{0.5}As_{0.93}Sb_{0.07}$ passivation layer (4) with a thickness of about 150 nm is grown epitaxially at 530° C. for about 5 minutes.

In order to protect the $Al_{0.5}Ga_{0.5}As_{0.93}Sb_{0.07}$ layer from oxidation, the wafer is discharged from the MBE unit after the overgrowth of the passivation layer (4), and a 200 nm-thick silicon nitride layer (5) is applied as an antioxidant layer.

The silicon nitride layer is used as an etching mask in order to uncover the contact regions. The $Al_{0.5}Ga_{0.5}As_{0.93}Sb_{0.07}$ layer is removed in the regions intended for the contacting, with a wet chemical etching process using HCl and $H_2O_2$ in alcohol solution as well as subsequent rinsing with de-ionized water. Then a metal contact (6) is applied onto the prepared surface.

Figure 2:
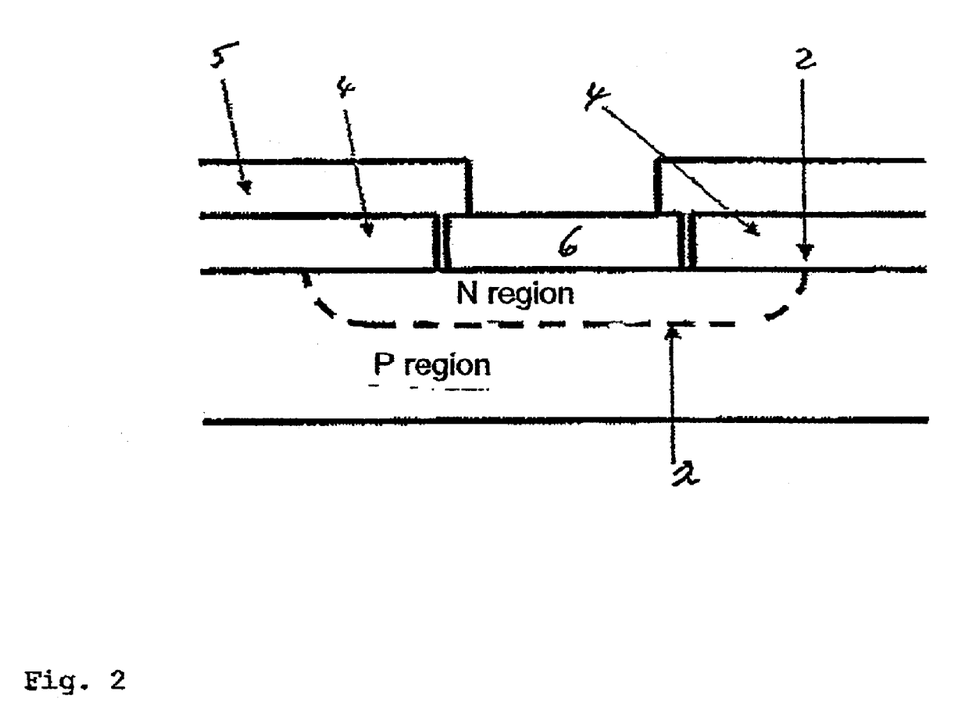
FIG. 2 shows a diagrammatic view of the layer sequence of a flat-processed component.

Referring to FIG. 2 and in contrast to FIG. 1, a p-n junction (2) is formed within the substrate thereby forming a flat-structured active semiconductor region. A flat $Al_n Ga_{1-n} As_m Sb_{1-m}$, e.g., an $Al_{0.05}Ga_{0.05}As_{0.93}Sb_{0.07}$ passivation layer (4) can be grown epitaxially to cover the substrate, and the passivation layer can be protected with an antioxidant layer, e.g., SiN. As with the FIG. 1, the antioxidant layer can be used as an etching mask to uncover the contact region. Again, the $Al_n Ga_{1-n} As_m Sb_{1-m}$, e.g., the $Al_{0.05}Ga_{0.05}As_{0.93}Sb_{0.07}$ layer can be removed in the regions intended for the contacting, with a wet chemical etching process using HCl and $H_2O_2$ in alcohol solution as well as subsequent rinsing with de-ionized water. Then a metal contact (6) can be applied onto the prepared surface embodiment.

Figure 3:
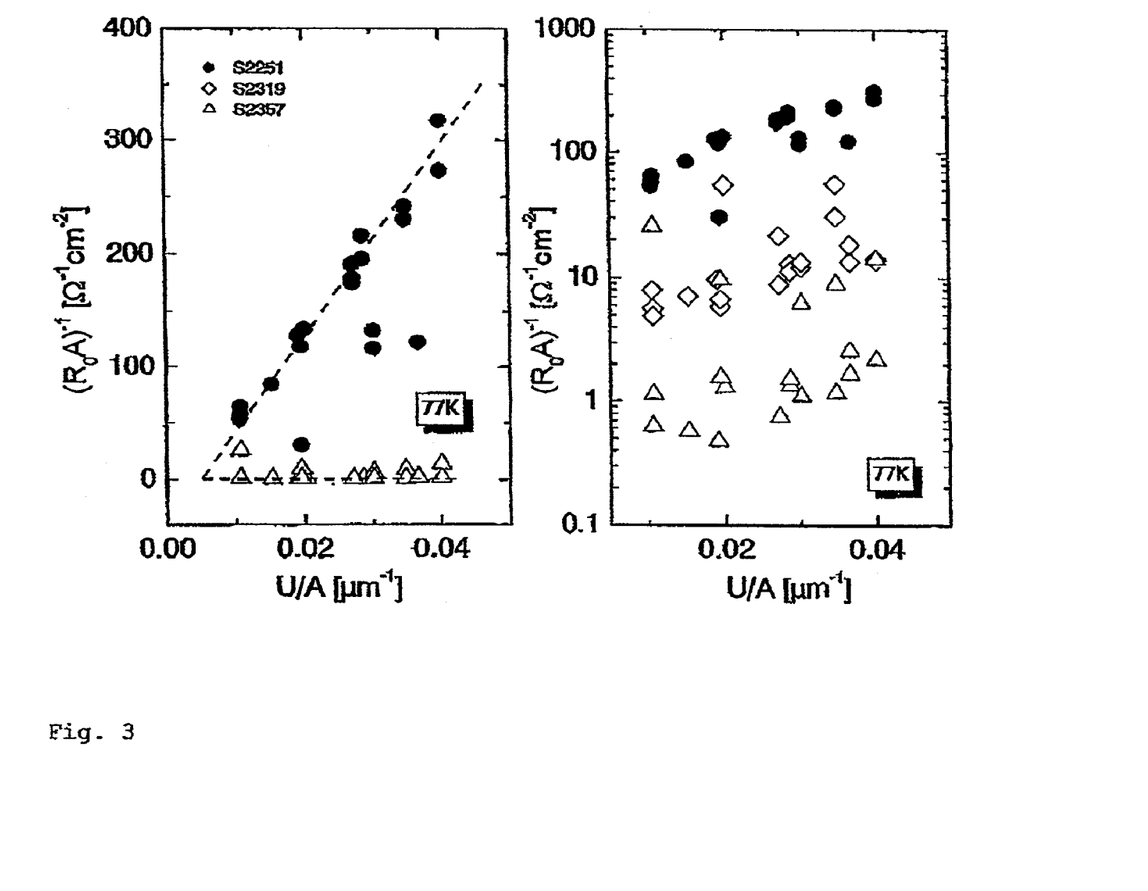
FIG. 3 shows a graph of the surface leakage currents of an infrared photodiode as a function of the quality of the $Al_n Ga_{1-n} As_m Sb_{1-m}$ passivation layer.

Referring to FIG. 3, the quality of the passivation layer has a direct effect on the surface leakage currents. As a measurement of the leakage current, the inverse of the differential resistance $(R_0 A)^{-1}$ for various geometries is plotted over the ratio of circumference to surface (U/A). $R_0$ thereby denotes the derivation of the current-voltage characteristic dU/dI of the component at U=0V. Circumference and surface are determined at the site of the p-n junction. The linear rise of $(R_0 A)^{-1}$ with increasing U/A ratio (circles) can be attributed to the occurring surface leakage currents. With an $Al_n Ga_{1-n} As_m Sb_{1-m}$ passivation layer according to the invention, these leakage currents can be reduced by a factor of more than 1000, so that they can no longer be detected by measurement techniques. The leakage currents are then independent of the U/A ratio (triangles).

Figure 4:
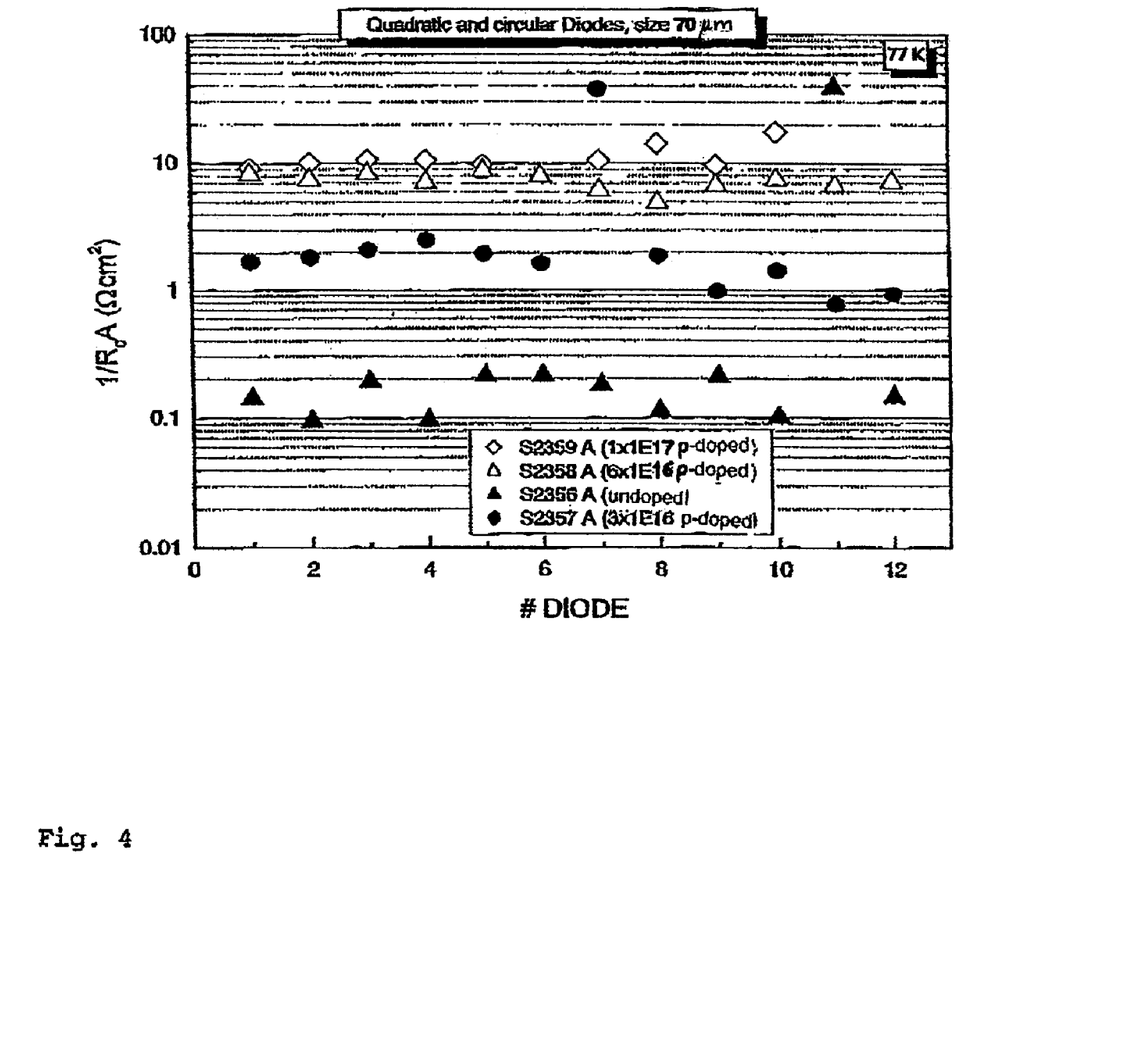
FIG. 4 shows a graph of the surface leakage currents as a function of the doping of the $Al_n Ga_{1-n} As_m Sb_{1-m}$ passivation layer.

The surface leakage currents are affected by the position of the Fermi level in the region of the p-n junction. Since the position of the Fermi level can be affected by additional doping of the passivation layer, the surface leakage current can also be affected by doping the passivation layer. FIG. 4 shows the inverse of the differential resistance $(R_0A)^{-1}$ as a measurement of the leakage current for various infrared photodiodes with different doping of the passivation layer. For example, an undesirable raising of the leakage currents through increasing beryllium doping is shown here. Of course, one skilled in the art will seek an optimum dopant and its concentration as a function of the component and the precise composition of the passivation layer, in order to reduce the surface leakage currents further.

The invention claimed is:

1. A semiconductor component comprising $Al_xGa_yIn_{1-x-y}As_zSb_{1-z}$, wherein parameters x, y, and z are selected to achieve a bandgap of less than 350 meV, the component comprising:
   a mesa-structuring comprising an active region; and
   a passivation layer comprising $Al_nGa_{1-n}As_mSb_{1-m}$ applied at least partially on at least one lateral surface of the mesa structuring, wherein the parameter n is selectable within a range of 0.5 to 0.85 and the parameter m is selectable within a range of 0 to 1.

2. The semiconductor component according to claim 1, characterized in that the active region comprises individual layers containing InAs and $Ga_yIn_{1-y}Sb$ with layer thicknesses of about 2 nm to about 10 nm.

3. The semiconductor component according to claim 1, wherein the parameter m is selected in the range of 0 to 0.15.

4. The semiconductor component according to claim 3, characterized in that the parameter m is 0.07.

5. The semiconductor component according to claim 1, wherein the passivation layer comprises one of a p-doping or an n-doping.

6. The semiconductor component according to claim 1, wherein the passivation layer is doped with one of beryllium or tellurium.

7. The semiconductor component according to claim 1, further comprising a bipolar semiconductor component.

8. The semiconductor component according to claim 7, wherein the bipolar component comprises a bipolar photodiode.

9. The semiconductor component according to claim 1, further comprising an antioxidant layer applied at least partially on the passivation layer.

10. The semiconductor component according to claim 9, wherein the antioxidant layer comprises $Si_pN_q$ and/or $SiO_2$ and/or $SiO_pN_q$.

11. The semiconductor component according to claim 1, wherein at least one lateral surface of the mesa structures is present in (010), (0-10), (100), or (-100) orientation.

12. The semiconductor component according to claim 1, further comprising a metal contact located on surface regions not covered by the passivation layer.

13. A method for the production of a semiconductor component comprising:
   producing at least one active semiconductor region of an $Al_xGa_{1-n}In_{1-x-y}As_zSb_{1-z}$-containing material with a bandgap of less than 350 meV;
   forming mesa structures in the at least one active semiconductor region;
   applying a passivation layer containing $Al_nGa_{1-n}As_mSb_{1-m}$ on at least one lateral surface of the mesa structures, whereby parameter n is selectable in a range of 0.5 to 0.85 and the parameter m is selectable in a range of 0 to 1.

14. The method according to claim 13, further comprising producing the active semiconductor region from at least one layer containing InAs with a thickness of about 2 nm to about 10 nm, on which at least one layer containing $Ga_yIn_{1-y}Sb$ with a thickness of about 2 nm to about 10 nm is applied.

15. The method according to claim 13, wherein at least one of:
   parameter m is selectable within the range of 0 to 0.15.

16. The method according to claim 13, further comprising adding a dopant to the passivation layer.

17. The method according to claim 13, further comprising applying an antioxidant layer on a side of the passivation layer facing away from the active semiconductor region.

18. The method according to claim 13, further comprising producing at least one of the active semiconductor region and/or the passivation layer by molecular beam epitaxy.

19. The method according to claim 13, wherein forming the mesa structures takes place by photolithography.

20. The method according to claim 13, wherein before the passivation layer is applied, the method comprises cleaning the surface of the active semiconductor region by thermal desorption.

21. The method according to claim 20, wherein the thermal desorption takes place at a temperature of about 500° C. to about 620° C.

22. The method according to claim 21, wherein the thermal desorption is undertaken with simultaneous antimony stabilization.

23. The method according to claim 13, wherein the semiconductor component comprises an infrared photodiode array.

24. A semiconductor component comprising $Al_xGa_yIn_{1-x-y}As_zSb_{1-z}$, wherein parameters x, y, and z are selected to achieve a bandgap of less than 350 meV, the component comprising:
   a flat-structuring; and
   a passivation layer comprising $Al_nGa_{1-n}As_mSb_{1-m}$ being applied to at least partially cover the flat-structuring, wherein the parameter n is selectable within a range of 0.5 to 0.85 and the parameter m is selectable within a range of 0 to 1.

25. A semiconductor component comprising $Al_xGa_yIn_{1-x-y}As_zSb_{1-z}$, wherein parameters x, y, and z are selected to achieve a bandgap of less than 350 meV, the component comprising:
   a mesa-structuring comprising an active region; and
   a passivation layer comprising $Al_nGa_{1-n}As_mSb_{1-m}$ applied at least partially on at least one lateral surface of the mesa structuring, wherein the parameter n is selectable within a range of 0.5 to 0.85 and the parameter m is selectable within a range of 0 to 0.15.

26. The semiconductor component according to claim 25, characterized in that the active region comprises individual layers containing InAs and $Ga_yIn_{1-y}Sb$ with layer thicknesses of about 2 nm to about 10 nm.

27. The semiconductor component according to claim 25, wherein the passivation layer comprises one of a p-doping or an n-doping.

28. The semiconductor component according to claim 25, wherein the passivation layer is doped with one of beryllium or tellurium.

29. The semiconductor component according to claim 25, further comprising a bipolar photodiode.

30. The semiconductor component according to claim 25, further comprising an antioxidant layer applied at least partially on the passivation layer.

31. The semiconductor component according to claim 30, wherein the antioxidant layer comprises $Si_pN_q$ and/or $SiO_2$ and/or $SiO_pN_q$.

32. The semiconductor component according to claim 25, further comprising a metal contact located on surface regions not covered by the passivation layer.

* * * * *